(12) United States Patent
DeYoung et al.

(10) Patent No.: US 6,989,172 B2
(45) Date of Patent: Jan. 24, 2006

(54) METHOD OF COATING MICROELECTRONIC SUBSTRATES

(75) Inventors: James P. DeYoung, Durham, NC (US); James B. McClain, Raleigh, NC (US); Stephen M. Gross, Chapel Hill, NC (US); Doug Taylor, Franklinton, NC (US); Mark I. Wagner, Raleigh, NC (US); David Brainard, Wake Forest, NC (US)

(73) Assignee: Micell Technologies, Inc., Raleigh, NC (US)

( * ) Notice: Subject to any disclaimer, the term of this patent is extended or adjusted under 35 U.S.C. 154(b) by 0 days.

(21) Appl. No.: 10/681,515

(22) Filed: Oct. 8, 2003

(65) Prior Publication Data

US 2004/0146636 A1 Jul. 29, 2004

Related U.S. Application Data

(60) Provisional application No. 60/442,867, filed on Jan. 27, 2003.

(51) Int. Cl.
*B05D 5/12* (2006.01)
*B05D 1/18* (2006.01)

(52) U.S. Cl. .................. 427/58; 427/335; 427/336; 427/337; 427/430.1; 427/443.1

(58) Field of Classification Search .............. 427/58, 427/335, 336, 337, 430.1, 443.2
See application file for complete search history.

(56) References Cited

U.S. PATENT DOCUMENTS 5,789,027 A    8/1998  Watkins et al.
6,083,565 A    7/2000  Carbonell et al.
6,194,650 B1   2/2001  Wakayama et al.
6,344,243 B1   2/2002  McClain et al.
6,497,921 B1  12/2002  Carbonell et al.
2003/0064149 A1  4/2003  Miller
2003/0165628 A1  9/2003  Simmons et al.

FOREIGN PATENT DOCUMENTS

WO    WO 02/066176    8/2002

OTHER PUBLICATIONS

Cabanas et al., *Deposition of Cu Films from Supercritical Fluids Using Cu(I) β-Diketonate Precursors*, Microelectronic Engineering, 64:53-61 (2002).
International Search Report for PCT/US03/38324; Date of mailing Sep. 30, 2004.

*Primary Examiner*—Brian K. Talbot
(74) *Attorney, Agent, or Firm*—Myers Bigel Sibley & Sajovec, P.A.

(57) ABSTRACT

A method of coating a substrate comprises the steps of: (a) providing a substrate in an enclosed vessel, the substrate having a surface portion; (b) at least partially filling the enclosed vessel with a first supercritical fluid so that said first supercritical fluid contacts the surface portion, with the first supercritical fluid carrying or containing a coating component; then (c) adding a separate compressed gas atmosphere to the reaction vessel so that a boundary is formed between the first supercritical fluid and the separate compressed gas atmosphere, said separate compressed gas atmosphere having a density less than said first supercritical fluid; and then (d) displacing said first supercritical fluid from said vessel by continuing adding said separate compressed gas atmosphere to said vessel so that said boundary moves across said surface portion and a thin film of coating component is deposited on said microelectronic substrate.

6 Claims, 4 Drawing Sheets

METHOD OF COATING MICROELECTRONIC SUBSTRATES

RELATED APPLICATIONS

This application claims the benefit of U.S. Provisional patent application Ser. No. 60/442,867, filed Jan. 27, 2003, the disclosure of which is incorporated by reference herein in its entirety.

FIELD OF THE INVENTION

The present invention concerns substrates such as microelectronic substrates and methods of depositing a coating component thereon, including electrically conductive coatings.

BACKGROUND OF THE INVENTION

The manufacture of microelectronic devices (semiconductors based on silicon or compound semiconductors, integrated circuits, logic, memory, etc as well as magnetic recording media, displays, LEDs, OLEDs, MEMS, MEOMS, Rf devices, etc.) is progressing toward needing $scCO_2$-based processes to deliver performance-enabling manufacturing technology in a wide range of process applications (cleaning, stripping, etching, polymer-layer deposition, photoresist deposition, photoresist manipulation, lithographic image development, CMP, metal layer deposition, seed layer deposition, barrier layer deposition, and metal fill steps). A broad family of these needed applications is the deposition of thin and often conformal films onto surfaces in the manufacture of microelectronic devices, or specifically semiconductors.

High purity metals and metal oxides are of great importance to the microelectronic industry, as are the deposition processes that can provide thin and conformal films. As minimum feature sizes shrink and certain device structures require deposition into high aspect ratio structures, conventional physical vapor deposition (PVD) processes fail to deliver needed film qualities. While chemical vapor deposition (CVD) can deliver enhanced conformality, the need for precursor volatility can limit the metal precursor sources. Additionally, it is not believed that CVD techniques will meet the stringent requirements of the 45-nm node and beyond.

Atomic Layer Deposition (ALD) is a heavily evaluated technique that has not yet broadly impacted the microelectronics industry. It is believed that ALD can deliver the needed metallic film qualities at the 45-nm node and beyond. However, this technology is not without limitations. ALD is a cyclical process where alternating cycles of chemical reagents are applied to a substrate under vacuum. During each so-called half cycle, a monolayer or a fraction of a monolayer is chemisorbed to the substrate surface and a subsequent redox reaction takes place. Because the reaction chemistry is controlled at the surface, the films are typically very conformal but application of films of appreciable thickness is notably slower than conventional processes. Additionally, ALD being a vacuum process presents an integration challenge for the adoption of porous low k materials in that barrier application using ALD can intercalate barrier materials into the pore structure of the insulator layers.

In the field of semiconductor device manufacturing, deposition processes can be characterized by sidewall step coverage and aspect ratio. Sidewall step coverage is defined as the ratio of a layer's thickness on the sidewall of a feature to that on a horizontal surface adjacent to the feature and is generally expressed as a percentage. Aspect ratio is defined as the height of a feature (e.g., a via or trench) versus the width of the feature. A drawback of the conventional copper interconnect dual damascene and single damascene process is the low sidewall step coverage obtained for Ta and TaN copper interconnect barrier layers formed using Physical Vapor Deposition (PVD) techniques. For high aspect ratio via and trench features (e.g., aspect ratios of 4:1 and greater), the sidewall step coverage obtained with PVD techniques is typically around 10%. Atomic Layer Deposition (ALD) has been investigated to overcome this problem, but is inherently slow.

Metal deposition processes also need to be flexible to the application of new materials needed to meet the changing needs of the microelectronics industry. Both CVD and ALD rely heavily on the availability of volatile precursors. What is needed is a technique that meets the stringent requirements of the 45-nm node and beyond and also provides few limitations in terms materials and processing parameters.

Liquid and supercritical $CO_2$ have been disclosed for deposition of a variety of materials to substrates including semiconductor wafers. In U.S. Pat. No. 6,001,148 DeSimone et al provide a method for spin-coating a liquid $CO_2$ soluble photoresist onto a semiconductor wafer. In U.S. Pat. No. 6,083,565 Carbonell et al show the use of liquid $CO_2$ in meniscus coating a variety of substrates with $CO_2$ soluble polymers. In U.S. Pat. No. 6,165,559 McClain et al show the use of liquid and supercritical $CO_2$ for application of predominantly polymeric films to solid substrates. All of these process methods exploit the low or nonexistent surface tension and extremely low viscosity of dense $CO_2$ to provide superior film qualities.

In U.S. Pat. No. 5,789,027 Watkins et al. provide a method for applying metallic films to substrates including semiconductor materials using supercritical CO2 to chemically deposit materials onto substrates. In the described process a metal organic precursor material is added to supercritical CO2 and exposed to a target substrate. For film growth to occur a chemical reagent, typically a reducing gas, is added to the supercritical CO2 composition to drive the chemical reaction that results in metal deposition. To specifically deposit metal on the substrate, the substrate is typically heated in a so-called 'cold-wall' reactor design. This method takes advantage of the ideal wetting properties (no surface tension, low viscosity) of the fluid media to provide high quality films. However, unlike ALD where reactions are self limiting, the chemical kinetics of this deposition method is not easily modeled or well understood. Furthermore, heat transfer from the substrate, which may be in excess of 200° C., to the fluid, at ideally a substantially lower temperature, is dynamic and substantially influences film properties. Additionally, this method will also result in deposition of metal into porous substrates limiting its integration capacity for porous low k materials. Finally, this process method has not demonstrated the ability to deposit contiguous conformal films down to and below 10 nm for barrier layer deposition at the 45-nm node and beyond.

What is needed is a method that exploits the fluid properties of liquid and supercritical CO2. What is needed is a method that is capable of preventing the intercalation of metal into porous substrates. What is needed is a method where the deposition of the metallic film is not complicated by heat transfer issues. What is needed is a method where the chemical kinetics can be understood and therefore controlled. What is needed is a method where the precursor material (organometallic) is separate and independent from the reaction step.

SUMMARY OF THE INVENTION

The invention encompasses a new method for coating a substrate with a film. It is particularly applicable to microelectronic substrates, the application of reactive materials, and the formation of metallic films. The technology is broadly referred to as Fluid Displacement Deposition (FDD). In general, FDD encompasses the steps of: dissolving or dispersing a $CO_2$-soluble or dispersable coating reagent, typically a reactive material, into liquid or supercritical carbon dioxide; using one of a variety of displacement methods to apply a thin film of the material to a substrate (particularly a microelectronic substrate); then, when necessary, reactively converting the coating reagent to a stable form.

A first aspect of the present invention is, accordingly, a method of coating a substrate (e.g., a microelectronic substrate). The method comprises the steps of:

(a) providing a substrate (e.g., a microelectronic substrate) in an enclosed vessel, the substrate having a surface portion;

(b) at least partially filling the enclosed vessel with a first supercritical fluid so that the first supercritical fluid contacts the surface portion, the first supercritical fluid carrying a coating component; then (c) adding a separate compressed gas atmosphere to the reaction vessel so that a boundary is formed between the first supercritical fluid and the separate compressed gas atmosphere, the separate compressed gas atmosphere having a density less than the first supercritical fluid; and then (d) displacing the first supercritical fluid from the vessel by continuing adding the separate compressed gas atmosphere to the vessel so that the boundary moves across the surface portion and a thin film of coating component is deposited on the substrate.

In one embodiment of the invention, the first supercritical fluid dissolves or disperses into the separate compressed gas atmosphere during the displacing step while the thin film of coating component is deposited, thus facilitating the deposition of the thin film.

One embodiment of the invention further comprises the step of: at least partially filling the enclosed vessel with a secondary compressed gas (which may be of the same composition as the separate compressed gas atmosphere as described herein), which secondary compressed gas preferably does not contain a coating component, between the providing step (a) and the at least partially filling step (b). This "pre-filling" step may be used, among other things, to fill a porous substrate so that the coating component is deposited primarily or substantially on the outer surface thereof, without substantially intercalating into and coating inner surfaces thereof.

In an embodiment of the invention, the first supercritical fluid and the second compressed gas atmosphere are in the vessel are at a pressure of between about 1,000 and 10,000 psi and a temperature of between about 30 and 250 degrees Centigrade.

In an embodiment of the foregoing, the first supercritical fluid comprises carbon dioxide; and the separate compressed gas atmosphere comprises at least one gas selected from the group consisting of helium, argon, nitrogen, oxygen, hydrogen, carbon dioxide, and mixtures thereof. In an embodiment of the foregoing, the thin film is from about 10 Angstroms to about 2 microns thick.

In an embodiment of the foregoing, the separate compressed gas atmosphere comprises heated carbon dioxide at a temperature at least 5 degrees centigrade higher than the temperature of the first supercritical fluid.

In one embodiment of the foregoing, the separate compressed gas atmosphere is in the physical form of a supercritical fluid; in another embodiment of the foregoing, the separate compressed gas atmosphere is in the physical form of a gas.

A further aspect of the present invention is a method for depositing a film of a material onto a surface of a substrate, the method comprising: (a) dissolving a precursor of the material into a solvent to form a supercritical or near-supercritical (for example, a solution having substantially the same solubilizing characteristics for the precursor as a supercritical fluid) solution; (b) forming a thin film of the solution on the substrate under conditions in which the precursor is stable in the solution; and then (c) contacting a conversion reagent to the thin film under conditions that initiate a chemical reaction involving the precursor and form a film of a chemically converted material on the surface of the substrate.

A method for depositing a film of a chemically converted material onto a surface of a substrate, the method comprising: (a) dissolving a precursor of the material into a liquid solution comprising $CO_2$; (b) contacting the liquid solution to the surface of the substrate under conditions in which the precursor is stable in the solution; and then (c) contacting a reaction reagent to a surface of the substrate under conditions that initiate a chemical reaction involving the precursor and deposit a chemically converted material onto the surface of the substrate.

A method for depositing a film of a chemically converted material onto a surface of a substrate, the method comprising: (a) dissolving a precursor of the material into a liquid solution comprising $CO_2$; (b) contacting the liquid solution to the surface of the substrate under conditions in which the precursor is stable in the solution; and then (c) heating the substrate to convert the precursor material to form a film of a chemically converted material on the substrate.

A method for depositing a film of a chemically converted material onto a substrate, the method comprising: (a) dissolving a precursor of the material into a liquid solution comprising $CO_2$; (b) forming a thin film of the solution formulation on the substrate, then (c) contacting a reaction reagent to the thin film under conditions that initiate a chemical reaction involving the precursor depositing a chemically converted material onto the substrate. In such methods the film formation step may be carried out by free meniscus coating from a composition comprising liquid $CO_2$; by spin coating from a composition comprising liquid $CO_2$; by displacing the liquid solution with a separate compressed gas atmosphere as described herein; etc.

The film-film forming step of methods described herein may be carried out by (i) displacing the solution with a separate compressed gas atmosphere or second supercritical fluid as described herein, (ii) lowering the density of solution so that the precursor precipitates onto the substrate, or (iii) combinations thereof. The contacting step may be carried out with the conversion reagent in a gaseous or supercritical phase. In an embodiment of the foregoing, the contacting step is carried out at a pressure less than ambient pressure.

In an embodiment of the foregoing, when the chemical reaction produces byproducts thereof, the byproducts can be removed by: (i) dissolving the byproducts in the supercritical or near-supercritical solution, (ii) dissolving the byproducts in a separate compressed gas atmosphere, or (iii) dissolving the byproducts in a subsequent fluid or compressed gas atmosphere.

In an embodiment of the foregoing, the solvent comprises carbon dioxide; and the material comprises a metal or metallic precursor.

In an embodiment of the foregoing, the chemically converted material comprises copper.

In an embodiment of the foregoing, the substrate comprises a semiconductor having vias formed therein, and wherein the surface comprises a via wall. In such embodiments, the the chemically converted material comprises a barrier material deposited on the via wall; the the chemically converted material comprises titanium nitride or tantalum nitride deposited on the via wall; or the chemically converted material comprises ruthenium deposited on the via wall.

In some embodiments the method may further comprise the step of seeding the via wall with copper after the barrier material is deposited on the via wall.

In some embodiments the method may further comprise the step of filling the via with copper subsequent to depositing the barrier material and without an intervening seeding step. Such filling may be carried out by any suitable technique, such as by electrofilling or carbon dioxide solvent deposition as described herein.

In methods of the invention as described herein, steps (b) and (c) may be cyclically repeated, for example from 1 to 1000 timesm to increase the thickness of the film of material deposited on the surface.

Chemical reactions utilized in carrying out the foregoing include but are not limited to reduction-oxidation (redox) reactions; reactions thermally activated at the substrate surface; disproportionation reactions; etc.

The foregoing and other objects and aspects of the invention are explained in greater detail in the drawings and specification set forth below.

DETAILED DESCRIPTION OF THE PREFERRED EMBODIMENTS

The present invention is explained in greater detail below. This description is not intended to be a detailed catalog of all the different ways in which the invention may be implemented, or all the features that may be added to the instant invention. For example, features illustrated with respect to one embodiment may be incorporated into other embodiments, and features illustrated with respect to a particular embodiment may be deleted from that embodiment. In addition, numerous variations and additions to the various embodiments suggested herein will be apparent to those skilled in the art in light of the instant disclosure which do not depart from the instant invention. Hence, the following specification is intended to illustrate some particular embodiments of the invention, and not to exhaustively specify all permutations, combinations and variations thereof.

1. Definitions.

"Coating component" as used herein refers to any material carried by the first fluid to be deposited on a substrate surface, including but not limited to metallic coating components, non-metallic coating components such as organic polymers, ceramic and glass materials, precursors of the foregoing, etc., as explained in greater detail below.

"Conversion reagent" as used herein refers to a chemical reagent such as a reducing agent that reacts with a precursor material such as an organometallic reagent to form a chemically converted material. Suitable examples are: hydrogen, borane, borides, ammonia, metal hydrides, silanes, phosphines, phosphides, and organometallic reagents capable of undergoing 'redox' reactions with reactive precursor materials.

"Reactive precursor material" as used herein refers to a material applied to a substrate that subsequently undergoes a chemical reaction with a conversion reagent or with exposure to heat and/or electromagnetic radiation.

"Reactive metal precursor" as used herein refers to a metal containing material, such as an organometallic reagent applied to a substrate that subsequently undergoes a chemical reaction with a conversion reagent or with exposure to heat and/or electromagnetic radiation.

"Chemically converted material" as used herein the product of a reactive precursor material upon conversion using a conversion reagent or heat and/or electromagnetic radiation.

"Separate compressed gas atmosphere" as used herein may be any suitable compressed gas which is present in the vessel at a density less than that of the first supercritical fluid under the conditions employed in carrying out the process. Examples of suitable gasses for the separate compressed gas atmosphere include, but are not limited to, helium, argon, nitrogen, oxygen, hydrogen, carbon dioxide, ozone, and mixtures thereof.

The disclosures of all United States patent references cited herein are to be incorporated herein in their entirety.

2. Substrates.

Examples of substrates devices that may be coated by the present invention include, but are not limited to, microelectronic devices such as microelectromechanical devices (MEMs), optoelectronic devices, and, semiconductor substrates in general.

Figure 1:
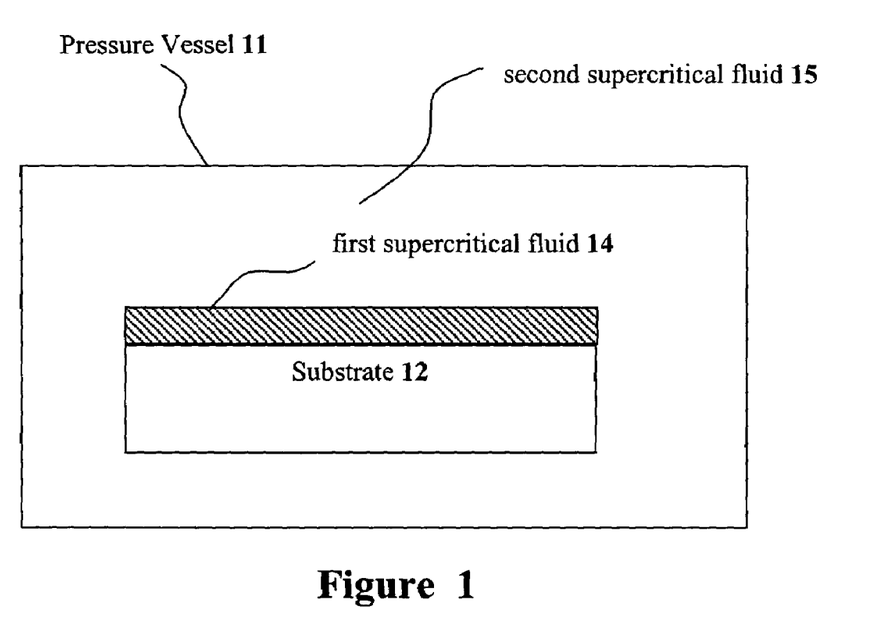
FIG. 1 schematically illustrates a substrate in a pressure cell, the substrate having a thin film of a supercritical fluid deposited thereon.
Figure 2:
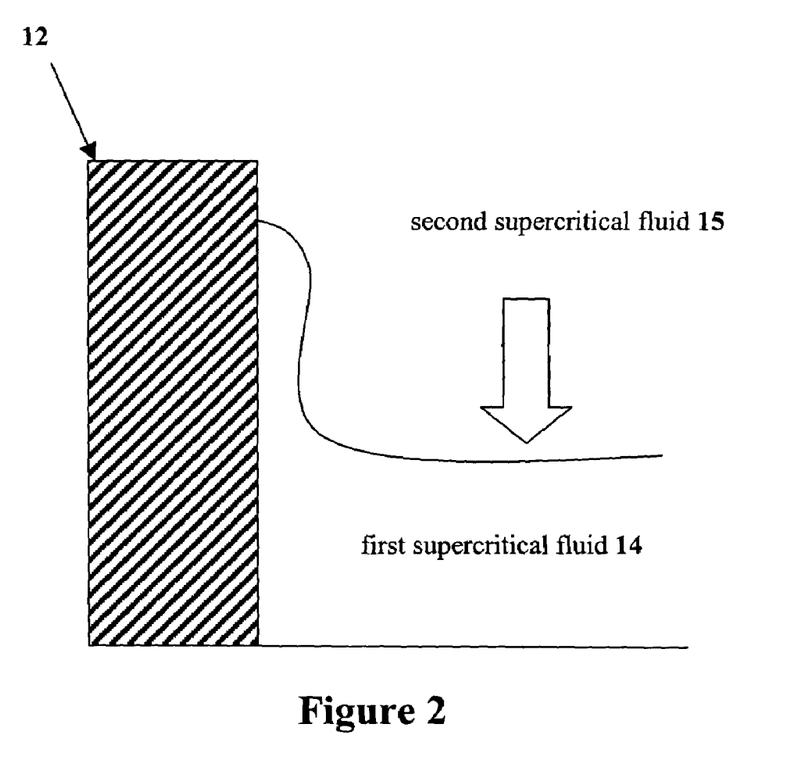
FIG. 2 schematically illustrates a process for forming the product illustrated in FIG. 1.

FIG. 1 schematically illustrates a substrate in a pressure vessel, the substrate having a thin film of a supercritical fluid deposited thereon. FIG. 2 schematically illustrates a process for forming the product illustrated in FIG. 1. In general, a pressure vessel 11 contains a substrate 12 to be coated with a film of a first supercritical fluid 14, the first supercritical fluid containing or carrying a coating component (e.g., solubilized, dissolved or dispersed therein). A second supercritical fluid or separate compressed gas atmosphere 15 is introduced into the pressure vessel (e.g. at a pressure slightly greater than the first supercritical fluid) and the first supercritical fluid forced from the vessel (e.g., through a back-pressure valve) so that the pressure in the vessel remains substantially the same. A thin film of the first supercritical fluid and/or the coating component is thereby deposited on the substrate. Without wishing to be bound to any particular theory, it is believed that the residual first supercritical fluid at the substrate interface quickly mixes with or diffuses into the second supercritical fluid or separate compressed gas atmosphere, leaving only the coating component at the surface of the substrate. Since the typically low-density second supercritical fluid/separate compressed gas atmosphere is not a good dispersing media or solvent for the coating component, this component remains isolated at the surface. Intervening steps or steps subsequent to the deposition step, such as reaction steps, may be performed on the coating component applied from the first supercritical fluid, as explained further herein.

3. First Supercritical Fluid and Separate Compressed Gas Atmosphere.

Carbon-dioxide compositions that may be used as the first supercritical fluid in carrying out the present invention typically comprise:

(a) carbon dioxide to balance, typically at least 20, 30, 40, 50 or 60 percent;

(b) from 0, 0.01, 0.1, 0.5, 1 or 2 percent to 5 or 10 percent or more of surfactant;

(c) from 0, 0.01, 0.1, 1 or 2 to 30, 40 or 50 percent or more of an organic co-solvent;

(d) optionally, from 0, 0.01, or 0.1 to 2 or 5 percent water; and (e) from 0.01, 0.1, or 1 to 2, 5 or 10 percent or more of a coating component distributed in the composition (e.g., as a solution or a dispersion).

The first supercritical fluid and separate compressed gas atmosphere in the vessel are typically at a pressure of between about 1,000 or 1,080 psig to about 5,000 or 10,000 psi and a temperature of between about 30 or 31 degrees Centigrade up to about 150 or 250 degrees Centigrade.

The thickness of the thin film will vary depending upon the particular coating format employed and ingredients optionally contained in the first supercritical fluid (e.g., coating components), but will typically be from about 10, 100 or 200 Angstroms to about 1 or 2 microns thick.

4. Coating Components.

The coating component may include one or more of CO2-philic polymers and polymeric materials dissolved or dispersed in formulated CO2 and polymer materials such as dielectrics, photoresists, lubricants, insulators, pigments, etc. (including, but not limited to pure CO2 at supercritical conditions; cosolvent-modified CO2 continuous phase; microemulsion domain of polar media—water (utilizing surfactant compositions of both CO2-philic and CO2-phobic structures; and combinations thereof); surface active materials (e.g. coatings that would associate, bind or bond to the surface (incluing but not limited to those described in U.S. Pat. No. 6,287,640); ceramic and glass precursor materials such as: silicon-network precursors (including but not limited to TEOS, hydrogen silsesquioxane (HSQ), methyl silsesquioxane (MSQ)) and other network precursors based on other semiconductors and on group IV and group V metals; metal atoms such as copper and aluminum; metal complexes dissolved or dispersed in the carrier solution; metal containing nanoparticles; metal containing clusters; metallic layer precursors dissolved or dispersed in the carrier solution (for example specific chemistries to form 'barrier-layer' materials in semiconductor fabricaion—Tantalum, Tungsten and Titanium Nitrides, Ruthenium, Carbides, Silicides, as well as binary and ternary materials such as those containing Boron.

5. Coating Procedures.

The coating process may be embodied in any convenient format, including but not limited to: Meniscus coating including all variations thereof, including but not limited to those described in U.S. Pat. Nos. 6,497,921 and 6,083,565; spin coating including all variations thereof, including but not limited to those described in U.S. Pat. No. 6,287,640); displacement coating as described herein, including 1) using a second low density supercritical fluid or compressed gas to displace a first supercritical fluid containing a coating component, or 2) using a gas or supercritical fluid to displace a liquid $CO_2$ composition containing a coating component 3) using gravity to drain a liquid CO2 composition containing a coating component 4) using physical movement of the substrate through a liquid, supercritical or dense phase CO2 composition containing a coating component; and precipitative coating, where a coating component is dissolved or dispersed in dense $CO_2$ under one set of conditions of temperature and pressure (density) and a second set of conditions, typically a reduction in pressure, temperature or both, is employed causing the coating component to precipitate out of the dense fluid and onto the substrate.

Once the coating component is deposited onto the substrate, the coating component may become reactively associated with the substrate surface. Typically, this is accomplished by 1) the addition of a conversion reagent otherwise known as a reagent, or 2) by heating of the substrate to drive the chemical reaction, or 3) both addition of a reagent and heating of the substrate. Typical chemical conversions include but are not limited to condensation reactions, disproportionation reactions, reduction-oxidation reactions (redox), hydrolysis reactions, and cross-linking reactions.

The present invention is explained in greater detail in the following non-limiting Examples.

EXAMPLE 1

Figure 3:
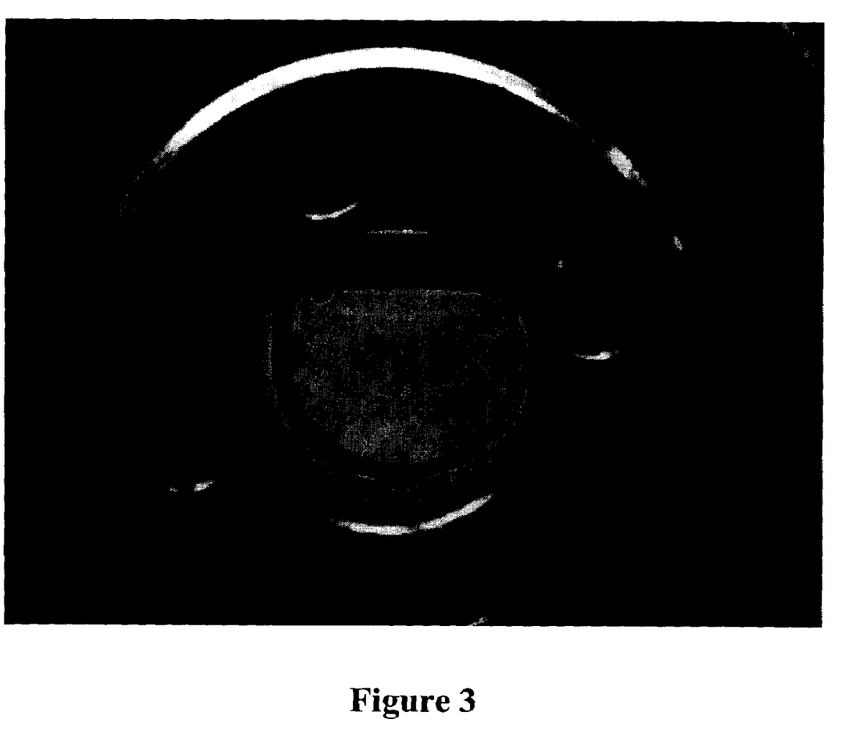
FIG. 3 shows the addition of helium to the top of a pressure cell containing supercritical carbon dioxide at a pressure of 2,500 psig, with the supercritical carbon dioxide being forced out of the cell through a drain at the bottom of the cell. The photograph is taken through a viewing port in the cell from a slightly elevated position.
Figure 4:
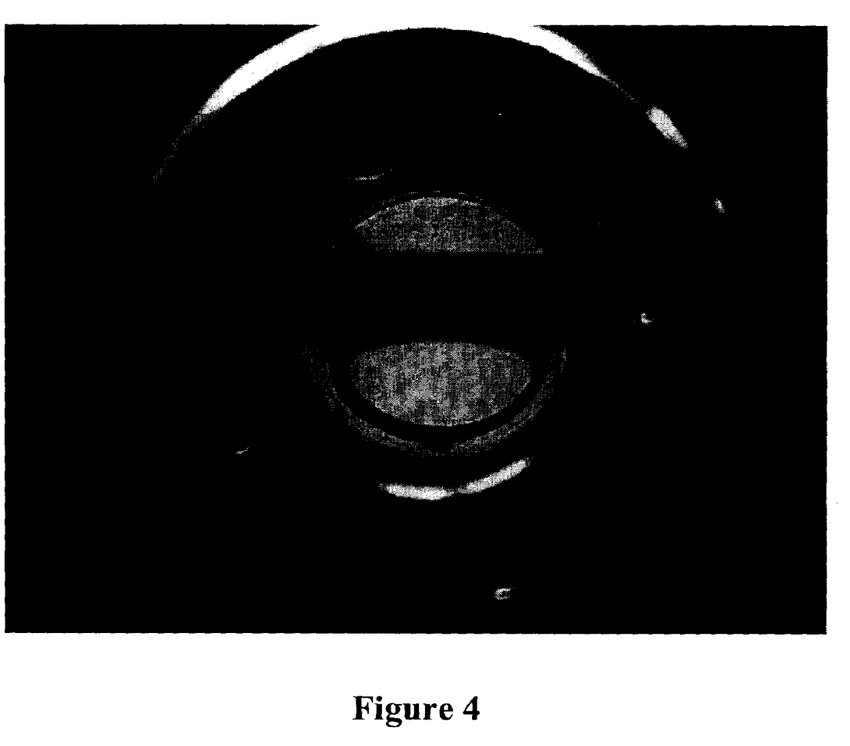
FIG. 4 is essentially the same as FIG. 3, except that it is taken at a later point in time after additional helium has been added.

Formation of a Boundary between Supercritical Helium and Supercritical Carbon Dioxide A high pressure view cell filled was filled with supercritical carbon dioxide at a temperature of about 55 degrees Centigrade and a pressure of about 2800 psig. The supercritical carbon dioxide contained a co-solvent N-methylpyrolidone (NMP) at less than about 4% by volume. Draining is through a back-pressure regulator to maintain near constant pressure within the cell. FIG. 3 shows the addition of supercritical helium to the top of the view cell at a pressure of about 2,900 psig and the same temperature as the supercritical carbon dioxide. The photograph is taken through a viewing port in the cell from a slightly elevated position. The supercritical helium is in the top portion of the cell, the supercritical carbon dioxide is in the bottom portion of the cell, and the supercritical carbon dioxide with the NMP is being forced out of the cell through a drain at the bottom of the cell. The formation of a boundary between the two supercritical fluids is observed as the dark border between the upper and lower regions in the cell. After additional time and after additional helium has been added it will be noted in FIG. 4 that additional supercritical carbon dioxide has been forced out of the drain at the bottom of the cell. A thin layer of the supercritical carbon dioxide, with any coating component carried therein, adheres to the view cell window, which represents a substrate being coated.

Figure 5:
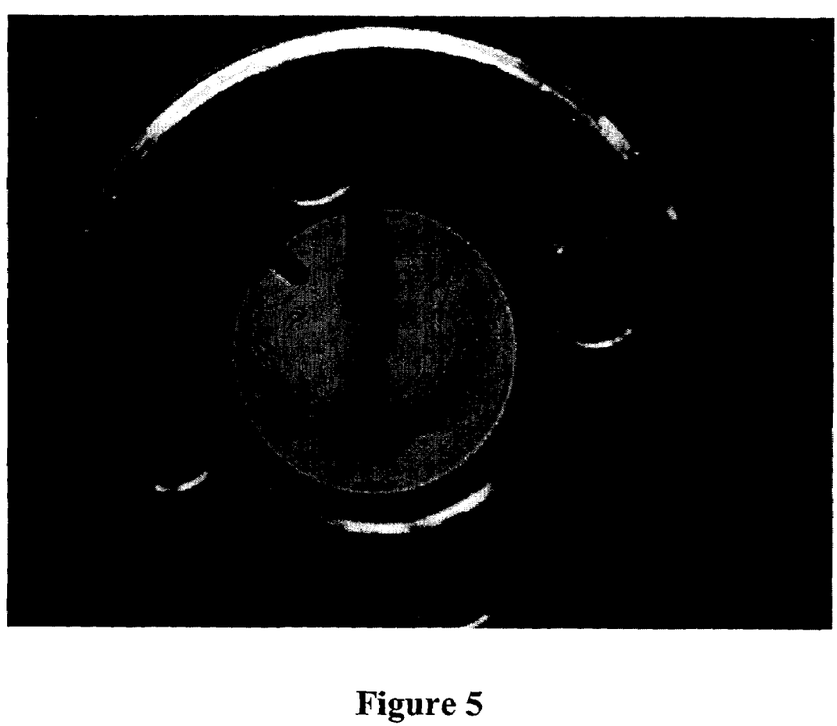
FIG. 5 shows the addition of supercritical carbon dioxide fluid to a pressure cell filled with supercritical helium. Note that the supercritical carbon dioxide appears to fall in a stream through the helium to the bottom of the cell.

FIG. 5 shows the addition of supercritical carbon dioxide fluid to a pressure cell filled with supercritical helium at about 2900 psig and about 55 degrees Centigrade, with the carbon dioxide being added at a slightly higher pressure of about 2950 psig. Note that the supercritical carbon dioxide falls in a stream through the helium to the bottom of the cell. The boundaries of this falling stream represent an boundary between the supercritical carbon dioxide and the supercritical helium and allows a coating component carried by the supercritical carbon dioxide to be deposited by the supercritical carbon dioxide onto a substrate, in this case the bottom of the view cell. Note that the carbon dioxide phase at the bottom is being allowed to drain through the bottom of the cell through a back-pressure regulator to maintain a near-constant pressure within the view cell.

EXAMPLE 2

Coating of a Substrate from Supercritical $CO_2$

A process for applying a coating component from supercritical carbon dioxide is described as follows. A substrate is added to a pressure vessel that is closed and sealed. A coating component dissolved in supercritical $CO_2$ is then added to the sealed vessel at 3000 psi and 50° C. Supercritical helium is then added to the top of the vessel at 3050 psi and 50° C. while a back-pressure regulator connected to a port on the bottom of the vessel is activated providing a pathway for the supercritical $CO_2$ to exit the pressure vessel while the pressure in the vessel remains nearly constant at 3050 psi. As the boundary between the two supercritical fluids passes over the substrate, a thin film of the first supercritical fluid containing the coating component is deposited on the substrate. The supercritical $CO_2$ in this thin film rapidly diffuses into the helium leaving the coating component deposited onto the substrate. The supercritical helium is then vented from the chamber leaving a thin film of the coating component on the substrate.

EXAMPLE 3

Coating of a Substrate with a Reactive Component from Supercritical $CO_2$ and Subsequent Conversion to a Stable Film A process for applying a reactive coating component from supercritical carbon dioxide is described as follows. A substrate is added to a pressure vessel that is closed and sealed. A reactive coating component dissolved in supercritical CO2 is then added to the sealed vessel at 3000 psi and 50° C. Supercritical helium is then added to the top of the vessel at 3050 psi and 50° C. while a back-pressure regulator connected to a port on the bottom of the vessel is activated providing a pathway for the supercritical CO2 to exit the pressure vessel while the pressure in the vessel remains nearly constant at 3050 psi. As the boundary between the two supercritical fluids passes over the substrate, a thin film of the first supercritical fluid containing the reactive coating component is deposited on the substrate. The supercritical CO2 in this thin film rapidly diffuses into the helium leaving the reactive coating component deposited onto the substrate. Hydrogen gas in then added to the predominantly helium environment and the substrate is heated causing the reactive component to be converted to a stabile film.

EXAMPLE 4

Deposition of Copper on a Microelectronic Substrate from Supercritical CO2

A process of forming a thick or multi-layer copper film is carried out as follows: 1) An organometallic precursor of Cu is dissolved in CO2 in a high pressure cell containing a substrate. 2) Helium gas is added to the pressure vessel slowly displacing the CO2 fluid mixture leaving a film of organometallic containing precursor on the substrate. 3) the pressure of the system is dropped by 10 atm facilitating rapid diffusion of CO2 from the surface film into the predominantly helium atmosphere, and 4) 10 atm of H2 gas is added to the pressure vessel while the substrate is heated to 220° C. to reduce the metallic species from oxidation state Cu(II) to Cu(0) leaving a metallic film. 5) the pressure vessel is then refilled with the CO2/organometallic mixture displacing the helium/H2 gas followed again by 6) slow helium displacement and 7) H2 reduction. This process is repeated several times to deposit a film of the desired thickness.

EXAMPLE 5

Deposition of a Copper Film onto a Microelectronic Substrate Using Liquid $CO_2$ A process for applying copper to a microelectronic substrate from liquid carbon dioxide is described as follows. A Cu(II) metal complex is dissolved in a liquid CO2 composition at a pressure of 1500 psi and a temperature of 20° C. in a pressure vessel containing a microelectronic substrate. Supercritical helium is then used to displace the liquid CO2 containing the Cu(II) species from the vessel at or near a constant pressure of 1550 psi. As the boundary between the liquid CO2 and the supercritical helium passes over the substrate a thin film of liquid CO2 containing the Cu(II) species is deposited onto the substrate. The pressure of the system is dropped by 10 atm facilitating diffusion of the residual liquid CO2 into the predominantly helium atmosphere. Ten atmospheres of hydrogen gas is then added and the substrate is heated to 220° C. to reduce the metallic species from oxidation state Cu(II) to Cu(0) leaving a metallic film. The pressure vessel is then refilled with the CO2/organometallic mixture displacing the helium/H2 gas followed again by slow helium displacement and H2 reduction. This process is repeated several times to deposit a film of the desired thickness.

EXAMPLE 6

Deposition of a Ruthenium Barrier Layer to an Etch Patterned Semiconductor Substrate from Liquid $CO_2$ A clean semiconductor wafer containing a top surface layer of a patterned dielectric material is added to a pressure chamber equipped with a wafer holding device, an infrared energy source to heat the wafer and its surface, and a pump and heat exchanger to maintain the bulk fluid at approximately 20° C. in the liquid state. Liquid $CO_2$ containing a $CO_2$ soluble Ru(II) precursor is added to the vessel containing the wafer to 2500 psi and 20° C. An additional ten atmospheres of hydrogen gas is added to the vessel and IR radiation is applied to the wafer surface to heat the wafer. Radiant and conducted heat is effectively removed from the fluid using the associative pump and heat exchanger to maintain the fluid temperature below the critical temperature of the mixture. After a nominal period of time, the radiation is stopped and the system is flushed with pure liquid CO2. The system is then vented and the wafer is isolated yielding a Ruthenium coated surface layer.

EXAMPLE 7

Deposition of a Ruthenium Barrier Layer to an Etch Patterned Semiconductor Substrate from supercritical $CO_2$ A clean semiconductor wafer containing a top surface layer of a patterned dielectric material is added to a pressure chamber equipped with a wafer holding device and an infrared energy source to heat the wafer and its surface. Supercritical $CO_2$ containing a $CO_2$ soluble Ru(II) precursor is added to the vessel containing the wafer to 2500 psi and 40° C. A second compressed gas comprising 5% Hydrogen and 95% CO2 at 100° C. and 2550 psia is added displacing the first supercritical CO2 and leaving a film of Ru(II) precursor. The precursor is effectively reduced to a Ru(0) film creating the byproducts of released ligands. The released ligands are solvated in the second compressed gas mixture. After a nominal period of time, the radiation is stopped and the system is flushed with pure liquid CO2. The system is then vented and the wafer is isolated yielding a Ruthenium coated surface layer.

EXAMPLE 8

Deposition of a Copper Film onto a Microelectronic Substrate Using Liquid $CO_2$ A process for applying copper to a microelectronic substrate from liquid carbon dioxide is described as follows. A Cu(I) metal complex capable of surface disproportionation is dissolved in a liquid CO2 composition at a pressure of 1500 psi and a temperature of 20° C. in a pressure vessel containing a microelectronic substrate. Supercritical helium is then used to displace the liquid CO2 containing the Cu(I) species from the vessel at or near a constant pressure of 1550 psi. As the boundary between the liquid CO2 and the supercritical helium passes over the substrate a thin film of liquid CO2 containing the Cu(I) species is deposited onto the substrate. The pressure of the system is reduced. The substrate is heated to 380° C. to reduce the metallic species from oxidation state Cu(I) to Cu(0) leaving a metallic film. The disproportionation byproducts are removed from the vessel by a flow of $CO_2$ or He or by reduction of pressure by vacuum. The pressure vessel is then refilled with the CO2/organometallic mixture and followed again by slow helium displacement and thermal reduction. This process is repeated several times to deposit a film of the desired thickness.

The foregoing is illustrative of the present invention, and is not to be construed as limiting thereof. The invention is defined by the following claims, with equivalents of the claims to be included therein.

That which is claimed is:

1. A method of coating a microelectronic substrate, comprising the steps of:
    (a) providing a microelectronic substrate in an enclosed vessel, said substrate having a surface portion;
    (b) at least partially filling said enclosed vessel with a first supercritical fluid so that said first supercritical fluid contacts said surface portion, said first supercritical fluid carrying a coating component; then
    (c) adding a separate supercritical fluid to said reaction vessel so that a boundary is formed between said first supercritical fluid and said separate supercritical fluid, said separate supercritical fluid having a density less than said first supercritical fluid; and then
    (d) displacing said first supercritical fluid from said vessel by continuing adding said separate supercritical fluid to said vessel so that said boundary moves across said surface portion and a thin film of coating component is deposited on said microelectronic substrate.

2. The method of claim 1, wherein said first supercritical fluid dissolves or disperses into said supercritical fluid during said displacing step while said thin film of coating component is deposited.

3. The method of claim 1, further comprising the step of:
    at least partially filling said enclosed vessel with a secondary compressed gas between said providing step (a) and said at least partially filling step (b).

4. A method according to claim 1, wherein said first supercritical fluid and said seperate supercritical fluid are in said vessel are at a pressure of between about 1,000 and 10,000 psi and a temperature of between about 30 and 250 degrees Centigrade.

5. A method according to claim 1, wherein:
    said first supercritical fluid comprises carbon dioxide;
    said separate supercritical fluid comprises at least one compound selected from the group consisting of helium, argon, nitrogen, oxygen, hydrogen, carbon dioxide, and mixtures thereof; and
    said thin film is from about 10 Angstroms to about 2 microns thick.

6. A method according to claim 1, wherein said separate supercritical fluid comprises heated carbon dioxide at a temperature at least 5 degrees centigrade higher than the temperature of said first supercritical fluid.

* * * * *